(12) United States Patent
Schaffrath

(10) Patent No.: US 9,817,372 B2
(45) Date of Patent: Nov. 14, 2017

(54) ARRANGEMENT WITH AN ACTUATOR

(71) Applicant: SIEMENS AKTIENGESELLSCHAFT, Munich (DE)

(72) Inventor: Niklas Schaffrath, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 336 days.

(21) Appl. No.: 14/651,399

(22) PCT Filed: Nov. 20, 2013

(86) PCT No.: PCT/EP2013/074252
§ 371 (c)(1),
(2) Date: Jun. 11, 2015

(87) PCT Pub. No.: WO2014/090530
PCT Pub. Date: Jun. 19, 2014

(65) Prior Publication Data
US 2015/0316900 A1 Nov. 5, 2015

(30) Foreign Application Priority Data
Dec. 14, 2012 (DE) .................. 10 2012 223 271

(51) Int. Cl.
G05D 1/00 (2006.01)
G05B 11/32 (2006.01)
(Continued)

(52) U.S. Cl.
CPC .............. *G05B 11/32* (2013.01); *G05B 15/02* (2013.01); *G06F 11/1004* (2013.01);
(Continued)

(58) Field of Classification Search
CPC ..... G05B 11/32; G05B 15/02; G06F 11/1004; G08C 17/02; G08C 2201/63; H03M 13/096
(Continued)

(56) References Cited

U.S. PATENT DOCUMENTS 3,378,817 A * 4/1968 Vitt .................. B61L 3/127
246/187 B
8,014,725 B2 * 9/2011 Danzer .................. G08B 29/16
455/67.11
(Continued)

FOREIGN PATENT DOCUMENTS

DE 1513172 A1 4/1969
DE 102004040059 A1 2/2006
(Continued)

*Primary Examiner* — Shardul Patel
(74) *Attorney, Agent, or Firm* — Laurence Greenberg; Werner Stemer; Ralph Locher

(57) ABSTRACT

An arrangement with an actuator has a transmitting device for transmitting control telegrams with a control command for the actuator. At least two receiving devices receive the control telegrams and generate a control signal for the actuator. A decision device between the receiving devices and the actuator allows the actuator to implement the control signals with a release signal if the control signal is present from all or a minimum number of receiving devices. The transmission device transmits the control command to each receiving device with a receiver-specific control telegram that is provided with a respective control instruction that indicates the continuous telegram number of the respective transmitted control telegram in encrypted or non-encrypted form. The receiving devices accept a control telegram as valid if the control instruction indicates a telegram number that is expected by the receiver. The control signal is generated if the control telegram is valid.

13 Claims, 4 Drawing Sheets

(51) Int. Cl.
*G06F 11/10* (2006.01)
*H03M 13/09* (2006.01)
*G05B 15/02* (2006.01)
*G08C 17/02* (2006.01)

(52) U.S. Cl.
CPC .......... *G08C 17/02* (2013.01); *H03M 13/096* (2013.01); *G08C 2201/63* (2013.01)

(58) Field of Classification Search
USPC ................. 701/1, 19, 41, 45; 714/1; 700/28; 180/282; 340/436
See application file for complete search history.

(56) References Cited

U.S. PATENT DOCUMENTS

| | | | | |
|---|---|---|---|---|
| 8,301,345 B2* | 10/2012 | Schmid | ................. | B60R 21/01 340/436 |
| 8,583,299 B2* | 11/2013 | Goodermuth | ......... | B60T 13/665 701/1 |
| 2007/0192668 A1* | 8/2007 | Hrebek | ................. | B61L 3/127 714/781 |
| 2008/0034248 A1* | 2/2008 | Danzer | ................. | G08B 29/16 714/1 |
| 2009/0125192 A1* | 5/2009 | Schmid | ................. | B60R 21/01 701/45 |

FOREIGN PATENT DOCUMENTS

| | | |
|---|---|---|
| EP | 1962442 A2 | 8/2008 |
| JP | 07111498 A | 4/1995 |
| WO | 2010057655 A1 | 5/2010 |
| WO | 2012037208 A1 | 3/2012 |

\* cited by examiner

ARRANGEMENT WITH AN ACTUATOR

BACKGROUND OF THE INVENTION

Field of the Invention

The invention relates to an arrangement for transmitting a control command for an actuator.

The object of the invention is to indicate an arrangement that can be manufactured using simple standard components, but nevertheless enables a secure transmission of control commands.

BRIEF SUMMARY OF THE INVENTION

This object is achieved according to the invention by an arrangement with the features as claimed. Advantageous designs of the arrangement according to the invention are indicated in dependent claims.

An arrangement is therefore proposed according to the invention with an actuator, at least one transmitting device for transmitting control telegrams which each contain a predefined control command for the actuator or as such themselves form the predefined control command, at least two receiving devices for receiving the control telegrams and generating a control signal for the actuator, and a decision device connecting the receiving devices to the actuator which allows a conversion of the control signals of the receiving devices by the actuator by means of a release signal only if the control signal is present from all receiving devices or at least a predefined minimum number of receiving devices, wherein the transmitting device is designed in such a way that it transmits the predefined control command in each case to each receiving device with a receiver-specific control telegram, wherein each receiver-specific control telegram is provided in each case with a check datum indicating the consecutive number of the respectively transmitted control telegram in encrypted or unencrypted form, and wherein each of the at least two receiving devices is designed in such a way that it accepts a received control telegram as valid for it on the basis of the check datum if the check datum indicates a telegram number which matches the consecutive telegram number expected at the receiving end and, if a valid control telegram is received, generates the control signal for the actuator in each case for a predefined time duration.

An essential advantage of the arrangement according to the invention consists in that an errored transmission and conversion of control commands is highly unlikely in said arrangement. The specific reason for this is that a control command is converted only if two receiving devices in each case receive receiver-specific control telegrams which are provided with a valid or correct telegram-number-specific and receiver-specific check datum. A check can be carried out through the transmission of a telegram-number-specific check datum in order to ascertain whether the incoming telegrams are transmitted and received in the correct order and therefore form a valid telegram sequence. A control command will be converted only if each of the two receiving devices in each case receives a correct telegram sequence in a receiver-specific manner.

A further essential advantage of the arrangement according to the invention consists in that the high degree of transmission reliability already mentioned is achievable with technically simple, commercially available and low-cost components.

Due to the transmission reliability achievable with the arrangement provided according to the invention, it is advantageously possible to deploy said arrangement in the domain of rail vehicle technology. It is thus possible, for example, to transmit control commands with which a brake of a rail vehicle can be released.

In terms of the design of the transmitting device, it is regarded as advantageous if said device has a check datum generator which generates the check datum in a receiver-specific manner for each receiving device depending on the consecutive telegram number of the control telegram to be transmitted and a receiver-specific seed datum or a receiver-specific seed value.

Check data can be generated particularly simply and therefore advantageously on the basis of pseudorandom numbers; accordingly, it is regarded as advantageous if the check datum generator has a pseudorandom number generator and the receiver-specific seed values are receiver-specific start values for the pseudorandom number generator and the check datum generator forms receiver-specific pseudorandom number sequences which are allocated to the telegram number sequence, and the pseudorandom number of the respective receiver-specific pseudorandom number sequence corresponding to the current telegram number of the telegram to be transmitted is selected as the receiver-specific check datum.

If pseudorandom numbers are used as a check datum, it is regarded as advantageous at the receiving end if each receiving device in each case has a reference pseudorandom number generator and a comparison device, wherein the reference pseudorandom number generator is suitable for generating the receiver-specific pseudorandom number sequence with the receiver-specific start value, and wherein the comparison device is designed in such a way that it checks for each receive telegram, on the basis of the consecutive telegram number, whether the transmitted pseudorandom number matches the expected pseudorandom number according to the pseudorandom number sequence, and generates the control command if the comparison of the check datum shows a match.

The comparison device is preferably designed in such a way that it regards the transmitted pseudorandom number as the expected pseudorandom number according to the pseudorandom number sequence if it falls within a sequence segment defined by a predefined number of sequentially consecutive pseudorandom numbers, in which segment the pseudorandom number expected on the basis of the consecutive telegram number also lies.

Additionally or alternatively to a pseudorandom number generator, the check datum generator of the transmitting device may comprise a hash value former which generates a receiver-specific hash value with the current telegram number of the telegram number sequence and a receiver-specific hash function as a receiver-specific hash value.

In the case of a transmission of receiver-specific hash values, it is regarded as advantageous if each receiving device in each case has a reference hash value former and a comparison device, wherein the reference hash value former is suitable for generating a reference hash value with the receiver-specific hash function and the telegram number of the next telegram expected on the basis of the consecutive telegram number of the previously received telegram, and wherein the comparison device is designed in such a way that it checks for each received telegram whether the transmitted hash value matches the reference hash value and generates the control command if the comparison shows a match.

As already mentioned at the outset, the arrangement can be deployed in the railway technology domain. In such a case, it is regarded as advantageous if the arrangement forms a control arrangement to control an actuator of a rail vehicle, and the transmitting device is designed in such a way that it generates a command for retaining an active actuator setting as a control command, and the actuator is designed in such a way that it reverts to a passive actuator setting if no release signal is present from the decision device.

In order to be able to detect an error in the transmission of the data telegrams at the transmitting end, it is regarded as advantageous if the receiving devices are designed in such a way that they acknowledge the receipt of control telegrams in each case by a transmission of an acknowledgement telegram with a receiver-specific and telegram-number-specific check datum to the transmitting device, and the transmitting device is designed in such a way that it sets the transmission of further control telegrams if the difference between the number of transmitted control telegrams and the number of received acknowledgement telegrams exceeds a predefined differential value.

The decision device can be formed particularly simply and economically by an AND element which forms the release signal for the actuator only if all receiving devices have generated the control signal.

The invention furthermore relates to a transmitting device for an arrangement as described above. According to the invention, it is provided in respect of a transmitting device of this type that the transmitting device is suitable for transmitting control telegrams which in each case contain a predefined control command for an actuator or as such themselves form the predefined control command, and the transmitting device is designed in such a way that it transmits the predefined control command in each case to each receiving device with a receiver-specific control telegram, wherein each receiver-specific control telegram is provided in each case with a check datum which indicates the consecutive telegram number of the respectively transmitted control telegram in encrypted or unencrypted form.

With regard to the advantages of the transmitting device according to the invention, reference is made to the advantages of the arrangement according to the invention specified above, since the advantages of the arrangement according to the invention correspond to those of the transmitting device according to the invention.

The invention furthermore relates to a receive arrangement for an arrangement as described above.

It is provided according to the invention that the receive arrangement has an actuator, at least two receiving devices for receiving control telegrams and generating a control signal for the actuator, and a decision device connecting the receiving devices to the actuator, which allows a conversion of the control signals of the receiving devices by the actuator by means of the release signal only if the control signal is present from all receiving devices or at least a predefined minimum number of receiving devices, wherein each of the at least two receiving devices is designed in such a way that it accepts a received control telegram as valid for it on the basis of a check datum if the check datum indicates a telegram number which matches the consecutive telegram number expected at the receiving end, and, if a valid control telegram is received, generates the control signal for the actuator in each case for a predefined time duration.

With regard to the advantages of the receive arrangement according to the invention, reference is made to the aforementioned advantages of the arrangement with a transmitting device according to the invention.

The invention furthermore relates to a method for operating an arrangement as described above. A method is provided according to the invention for operating an arrangement with an actuator, a transmitting device, at least two receiving devices, and a decision device connecting the receiving devices to the actuator, wherein, in the method:

control telegrams which in each case contain a predefined control command for the actuator or as such themselves form the predefined control command are transmitted with the transmitting device, the control telegrams are received and control signals are generated for the actuator with the at least two receiving devices, and the decision device allows a conversion of the control signals of the receiving devices by the actuator by means of a release signal only if the control signal is present from all receiving devices or at least a predefined minimum number of receiving devices, wherein the transmitting device transmits the predefined control command in each case to each receiving device with a receiver-specific control telegram, wherein each receiver-specific control telegram is in each case provided with a check datum which indicates the consecutive telegram number of the respectively transmitted control telegram in encrypted or unencrypted form, and wherein each of the at least two receiving devices accepts a received control telegram as valid for it on the basis of the check datum if the check datum indicates a telegram number which matches the consecutive telegram number expected of the receiving end, and, if a valid control telegram is received, generates the control signal for the actuator in each case for a predefined time duration.

With regard to the advantages of the method according to the invention, reference is made to the aforementioned advantages of the arrangement according to the invention, since the advantages of the arrangement according to the invention correspond to those of the method according to the invention.

BRIEF DESCRIPTION OF THE SEVERAL VIEWS OF THE DRAWING

The invention is explained in detail below with reference to example embodiments, wherein, by way of example.

DESCRIPTION OF THE INVENTION

For the sake of clarity, the same reference numbers are always used for identical or comfortable components in the figures.

Figure 1:
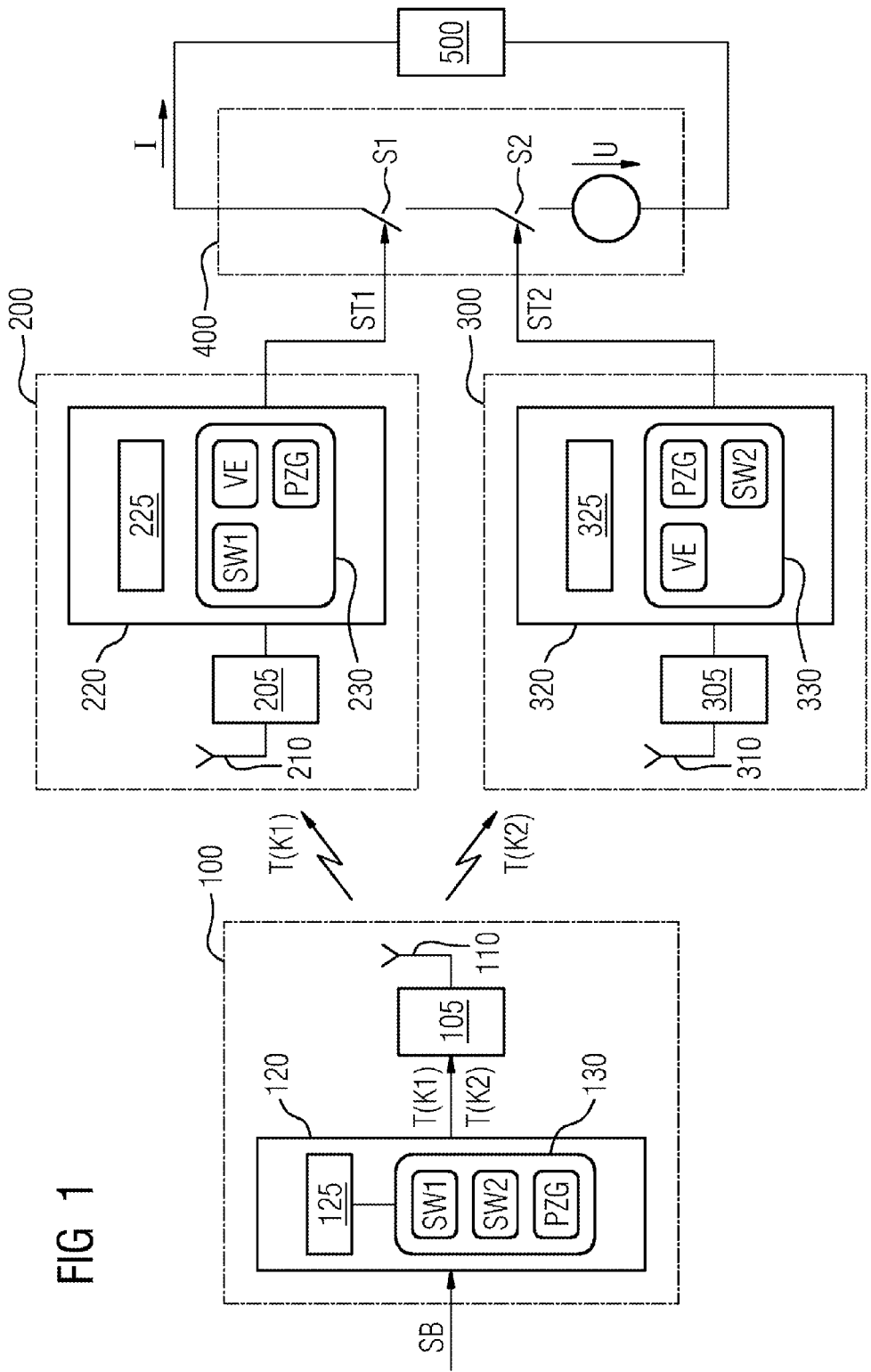
FIG. 1 shows an example embodiment of an arrangement in which check data are formed for receiver-specific control telegrams by pseudorandom numbers.

FIG. 1 shows an arrangement with a transmitting device 100, two receiving devices 200 and 300, a decision device 400 and an actuator 500.

The transmitting device 100 comprises a radio module 105 with an antenna 110 and/or computing device 120. The computing device 120 has a processor 125 which is connected to a memory 130 of the computing device 120.

A generator module PZG which can form pseudorandom number sequences when run by the processor 125 is stored in the memory 130 of the computing device 120. When run by the processor 125, the generator module PZG thus forms a pseudorandom number generator.

The generator module PZG can be started to generate different pseudorandom number sequences with different start values, of which two start values, i.e. the start value SW1 and the start value SW2, are stored in the memory 130. The start value SW1 is allocated to the receiving device 200, and the start value SW2 is allocated to the receiving device 300.

FIG. 1 furthermore shows the structure of the receiving device 200. A radio module 205 with an antenna 210 connected to it can be seen. A computing device 220 which has a processor 225 and a memory 230 is connected to the radio module 205.

A generator module PZG, which is identical to the generator module PZG of the transmitting device 100 or can at least form pseudorandom number sequences identical to those of the latter, is stored in the memory 230. The generator module PZG in the memory 230 serves to generate a reference pseudorandom number sequence which is identical to the pseudorandom number sequence of the transmitting device 100. In order to be able to generate the same pseudorandom number sequence in the receiving device 200 as in this transmitting device 100, the receiver-specific start value SW1 for the receiving device 200 is stored in the memory 230.

In addition, a comparison module VE which enables a comparison of pseudorandom numbers is stored in the memory 230. The function of the comparison module VE is explained in further detail below.

FIG. 1 also shows the structure of the receiving device 300. A radio module 305 with an antenna 310 and a computing device 320 can be seen. The computing device 320 comprises a processor 325 and a memory 330. In terms of the design or hardware structure, the receiving device 300 thus corresponds to the receiving device 200.

A generator module PZG which corresponds in terms of the mode of operation to the generator module PZG in the receiving device 200 and the generator module PZG in the transmitting device 100 is stored in the memory 330. The generator module PZG in the memory 330, when run by the processor 325 taking into account the receiver-specific start value SW2 stored in the memory 330, generates a reference pseudorandom number sequence which matches the pseudorandom number sequence of the transmitting device 100 when the generator module PZG is operated there with the start value SW2.

A comparison module VE which corresponds to the comparison module VE of the receiving device 200 is furthermore stored in the memory 330. The function of the comparison module VE of the receiving device 300 is explained in further detail below.

The two receiving devices 200 and 300 are connected on the output side to the decision device 400. The decision device 400 comprises two switches S1 and S2 which are electrically connected in series and form a logical AND element. The decision device 400 is furthermore equipped with a voltage source U which is connected in series to the two switches S1 and S2.

The two switches S1 and S2 can be activated or closed via control signals ST1 and ST2 of the two receiving devices 200 and 300 so that the decision device 400 generates a current I as a release signal when corresponding control signals ST1 and ST2 are applied and the two switches S1 and S2 are closed. The release signal or the current I flows through the actuator 500 which is activated in the case of a current flow.

The actuator 500 is preferably an actuator which assumes an active actuator setting only when the release signal is applied or in the case of current flow of the current I, and reverts to its passive actuator setting if no current I flows or no release signal is present. The actuator 500 may, for example be a brake release device for a brake of a rail vehicle not shown in detail. Such a brake release device releases the brake of the rail vehicle when the release signal is present and allows the brake to revert to its braking position when the release signal is not present so that the rail vehicle is forced to brake when the release signal is not present.

The arrangement according to FIG. 1 can be operated, for example, as follows:

If a release signal is to be generated for the actuator 500 in order to activate the actuator 500, for example to release a brake of a rail vehicle, a corresponding control command SB can be applied to the transmitting device 100. As soon as the control command SB is applied, the processor 125 will generate control telegrams T(K1) and T(K2) which are transmitted to the two receiving devices 200 and 300 and indicate the presence of the control command SB.

In the generation of the control telegrams T(K1) and T(K2), the processor 125 will generate receiver-specific check data which are added to the telegrams T(K1) and T(K2) and allow the two receiving devices 200 and 300 to check the correctness of the data telegram transmission. This will be explained in further detail with reference to an example:

For the generation of the control telegrams T(K1) for the receiving device 200, the processor 125 will activate the generator module PZG in order to generate a pseudorandom number sequence with the receiver-specific start value SW1 of the receiving device 200 and generate a receiver-specific pseudorandom number sequence for the receiving device 200. A pseudorandom number sequence of this type may, for example, read as follows: 3242, 4253, 6784, 3892, . . . .

Following the generation of the receiver-specific pseudorandom number sequence, the processor 125 will allocate the respective next pseudorandom number of the pseudorandom number sequence to each control telegram T(K1) which is transmitted to the receiving device 200.

For the first control telegram T(K1) which the transmitting device 100 transmits to the receiving device 200, the first pseudorandom number 3242 of the pseudorandom number sequence is thus allocated to the control telegram as a check datum. If the second control telegram T(K1) is to be transmitted to the receiving device 200, the pseudorandom number 4253 is added accordingly as a check datum. In a corresponding manner, the further pseudorandom numbers 6784, 3892, . . . , are allocated to the further control telegrams T(K1) which are transmitted to the receiving device 200.

In a corresponding manner, the processor 125 will generate a receiver-specific pseudorandom number sequence for the receiving device 300, taking into account the receiver-specific start value SW2. The pseudorandom number sequence for the receiving device 300 may, for example, read: 7824, 9238, 4279, 4379, . . . . Accordingly, for the first control telegram T(K2) to be transmitted to the receiving device 300, the processor 125 will therefore insert the pseudorandom number 7824 into the control telegram as a check datum and will transmit the control telegram with this check datum to the receiving device 300. The further pseudorandom numbers of the pseudorandom number sequence allocated to the receiving device 300 on a receiver-specific basis, i.e. the pseudorandom numbers 9238, 4279, 4379, etc., will be added to the further control telegrams T(K2) which are transmitted to the receiving device 300, and in fact in the corresponding order, corresponding to the pseudorandom number sequence.

The receiving device 200 will detect the receiver-specific control telegrams T(K1) which are intended for it on the basis of the pseudorandom numbers contained in the control telegrams. In addition, the receiving device 200 can verify whether the control telegrams T(K1) are received in the correct order. On reception of the first control telegram T(K1), the processor 225 will check whether the pseudorandom number 3242 contained in the control telegram T(K1) is the is the correct or expected pseudorandom number. In order to enable this, the processor 225 will activate its generator module PZG and will form its own pseudorandom number sequence taking into account the receiver-specific start value SW1.

It will then compare its own pseudorandom number sequence as a reference pseudorandom number sequence with the pseudorandom numbers of the incoming control telegrams T(K1): Following the reception of the first control telegram T(K1), the processor 225 will check with the aid of the comparison module VE whether the pseudorandom number 3242 contained in the control telegram T(K1) matches the first pseudorandom number of the self-generated pseudorandom number sequence. If so, the receiving device 200 will accept the control telegram T(K1) as valid and will generate a control signal ST1 on the output side with which the switch S1 is closed. The generation of the control signal ST1 will take place in each case for a predefined time duration of, for example, 100 milliseconds. If no further control telegram T(K1) with which the control command SB and the activation of the actuator 500 are further confirmed is received within this time duration, the generation of the control signal ST1 is terminated and the switch S1 is again opened.

In a corresponding manner, the computing device 220 will check the validity of the further incoming control telegrams T(K1) in each case by checking the pseudorandom numbers contained in the control telegrams T(K1) in order to ascertain whether said pseudorandom numbers correspond to the self-generated reference pseudorandom number sequence.

For the second, third and fourth control telegrams T(K1), the processor 225 will thus expect the pseudorandom numbers 4253, 6784 and 3892 and, on receiving a corresponding valid control telegram T(K1), will in each case again generate the control signal ST1 for the predefined time span or time duration.

The receiving device 300 operates in a corresponding manner, wherein, however, unlike the receiving device 200, with its own receiver-specific start value SW2, it forms its own pseudorandom number sequence which differs from the pseudorandom number sequence of the receiving device 200, since the two start values SW1 and SW2 also differ from one another.

Therefore, as soon as the receiving device 300 receives a first control telegram T(K2), the processor 325 will check whether the pseudorandom number contained in the control telegram T(K2) matches the expected pseudorandom number of the self-generated pseudorandom number sequence. Since the mode of operation of the generator module PZG of the computing device 320 corresponds to the mode of operation of the generator module PZG of the computing device 120, a pseudorandom number sequence 7824, 9238, 4279, 4379, . . . , which matches the pseudorandom number sequence which the processor 125 forms, taking into account the start value SW2, is thus formed in the computing device 320. If the receiving device 300 therefore receives a control telegram with the pseudorandom number 7824 as the first telegram T(K2), it will recognize this control telegram as valid and will generate a control signal ST2 to close the switch S2 of the decision device 400 for a predefined time duration of, for example, 100 milliseconds. In a corresponding manner, the control signal ST2 is generated in each case for a predefined time duration if further control telegrams T(K2) which are provided with the respective next pseudorandom number 9238, 4279, 4379, . . . of the receiver-specific pseudorandom number sequence are received in the receiving device 300.

To summarize, a control command SB which is fed in at the input of the transmitting device 100, i.e. is transmitted via receiver-specific control telegrams T(K1) and T(K2) to the two receiving devices 200 and 300 which in each case, on receiving a valid control telegram for a predefined time duration, form control signals ST1 and ST2 to activate the actuator 500. The validity of control telegrams is checked on the basis of receiver-specific check data which, in the example embodiment according to FIG. 1, are formed using a pseudorandom number generator and receiver-specific start values SW1 and SW2.

Figure 2:
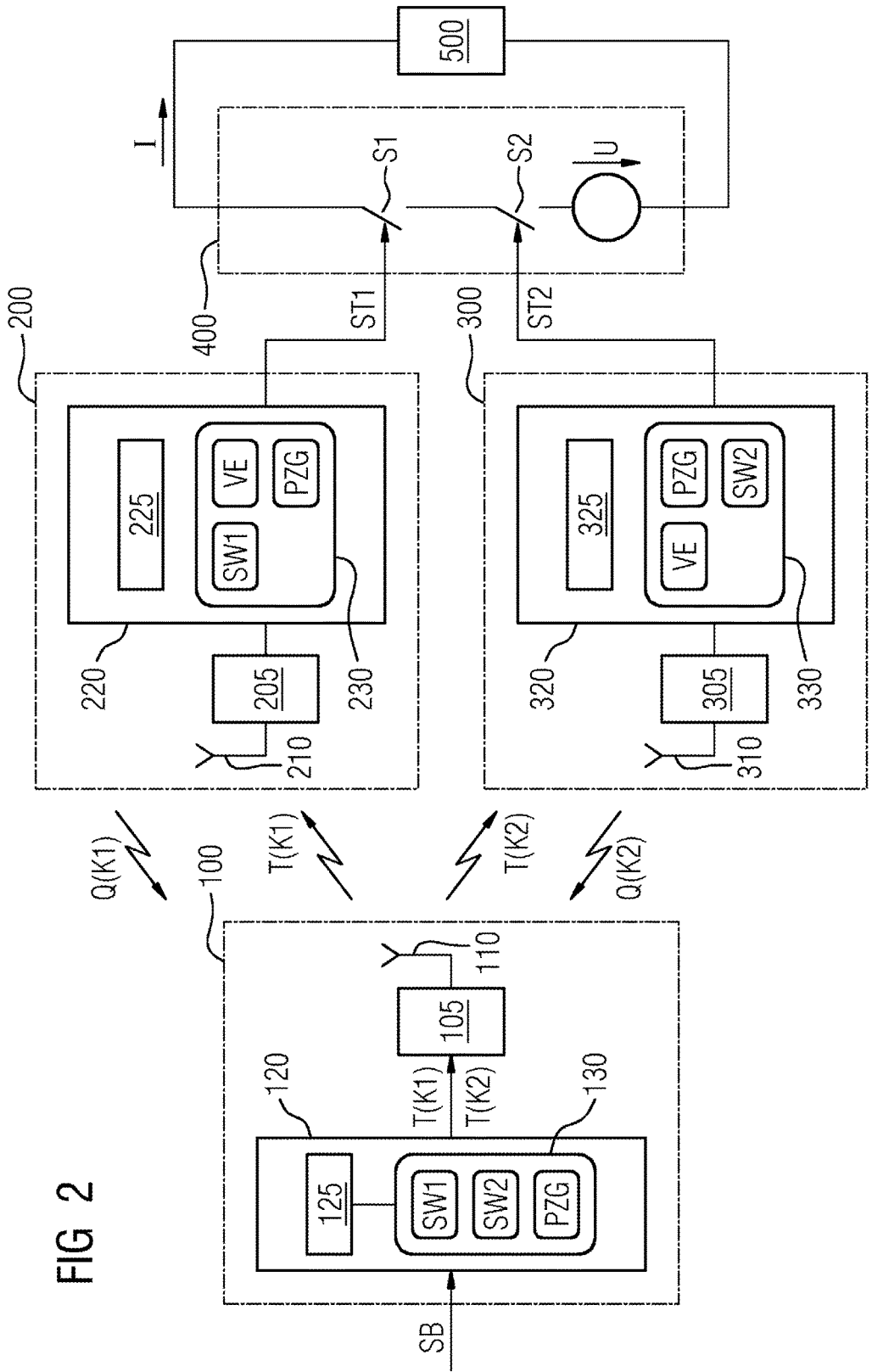
FIG. 2 shows an alternative design of the arrangement according to FIG. 1 in which receiving devices transmit acknowledgement signals with which they acknowledge the receipt of control telegrams.

FIG. 2 shows a variant of the arrangement according to FIG. 1. In the variant according to FIG. 2, the receiving devices 200 and 300, on receiving a valid control telegram T(K1) and T(K2), in each case generate an acknowledgement signal Q(K1) and Q(K2) with which they acknowledge the receipt of a valid control telegram. The telegram number or the pseudorandom number of the pseudorandom number sequence allocated at the receiving end corresponding to the respective telegram number is preferably contained in the acknowledgement signals Q(K1) and Q(K2) in each case in encrypted or unencrypted form. The computing device 120 of the transmitting device 100 can thus track how many of the transmitted control telegrams T(K1) and T(K2) are received and processed at the receiving end. If the transmitting device 100 establishes that the difference between the number of transmitted control telegrams T(K1) and T(K2) and the number of received acknowledgement telegrams Q(K1) and Q(K2) exceeds a predefined differential value, it will assume that the transmission of the control telegrams is not functioning in an error-free manner and will stop the transmission of further control telegrams. In such a case, the receiving devices 200 and 300 will then stop the generation of further control telegrams ST1 and ST2 so that the decision device 400 will deactivate the actuator 500.

In the example embodiments according to FIGS. 1 and 2, the control telegrams T(K1) and T(K2) and the acknowledgement telegrams Q(K1) and Q(K2) are transmitted via a radio link. Alternatively or additionally, it is obviously possible to transmit the control telegrams and the acknowledgement telegrams in a different, for example wired or cable-connected, manner, in particular by means of electrical or optical signals. Alternatively, a transmission by means of infrared or other radiation is also conceivable.

Figure 3:
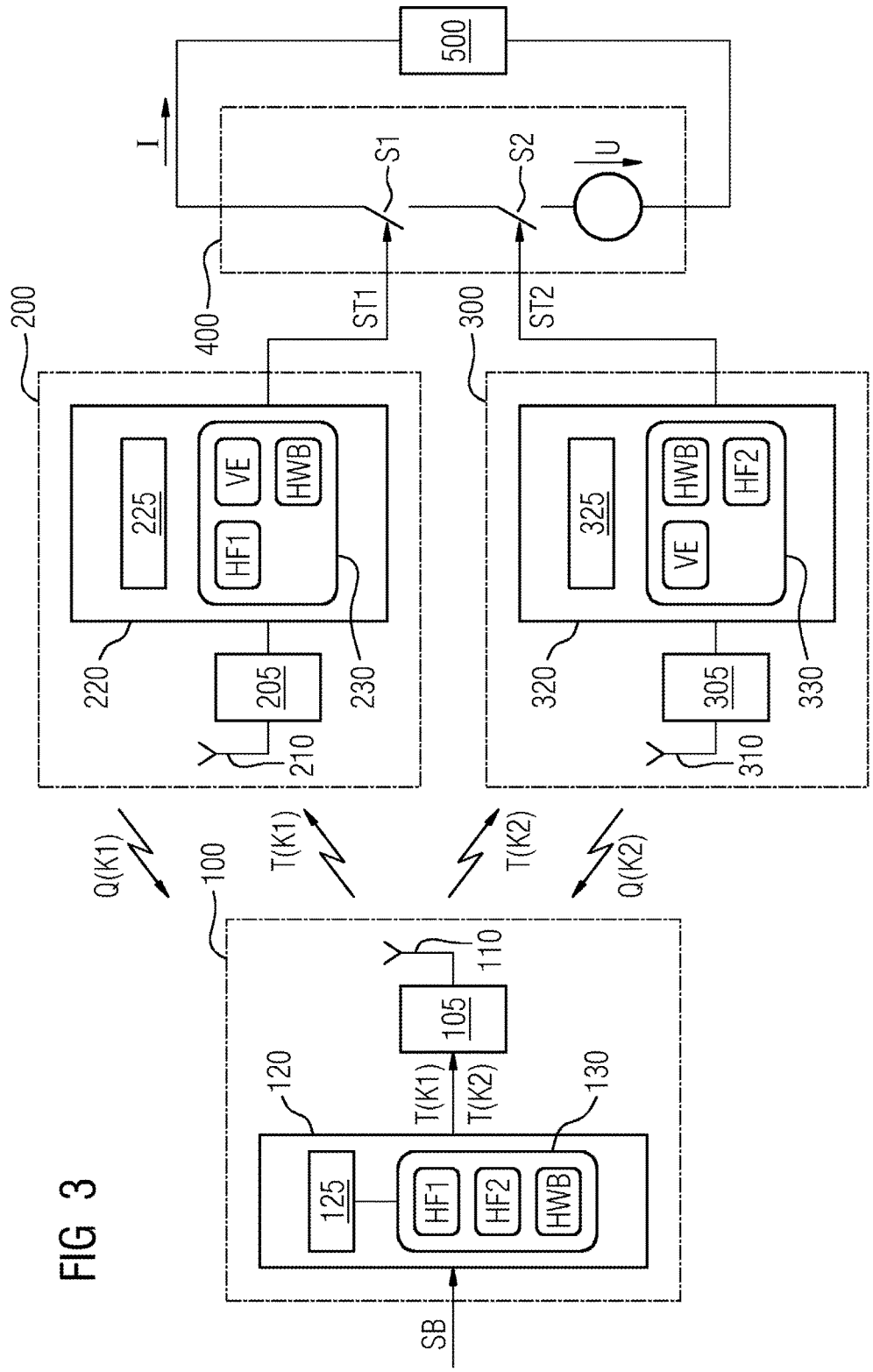
FIG. 3 shows an example embodiment of an arrangement in which check data are formed for receiver-specific control telegrams by means of hash functions.

FIG. 3 shows a further example embodiment of an arrangement with a transmitting device 100, two receiving devices 200 and 300, a decision device 400 and an actuator 500.

In terms of the hardware, the arrangement according to FIG. 3 corresponds to the arrangement according to FIGS. 1 and 2. The only difference lies in the programming of the processor 125, 225 and 325 with regard to the generation of check data with which the validity of the control telegrams T(K1) and T(K2) can be checked.

As shown in FIG. 3, no generator modules PZG for generating pseudorandom number sequences, let alone start values SW1 and SW2 for generator modules PZG of this type, are stored in the memories 130, 230 and 330. Instead, in the arrangement according to FIG. 3, a hash value former HWB and receiver-specific hash functions HF1 and HF2 are in each case stored in the memories 130, 230 and 330. The mode of operation of the hash value former HWB and the function of the receiver-specific hash functions HF1 and HF2 will be explained in detail below by way of an example:

In the generation of the receiver-specific control telegrams T(K1) and T(K2) as a receiver-specific check datum, the transmitting device 100 will in each case generate a receiver-specific and telegram-number-specific hash value. If the transmitting device 100 intends, for example, to transmit a first control telegram T(K1) to the receiving device 200, it will process, with the hash value former, the telegram number "1" of the first control telegram using the receiver-specific hash function HF1 which is allocated to the receiving device 200 and will generate a hash value which, due to the application of the receiver-specific hash function HF1, taking account of the telegram number "1", is both receiver-specific and telegram-number-specific. The hash value is added to the control telegram T(K1) and is transmitted with the latter to the receiving device 200.

The receiving device 200 has a hash value former HWB corresponding to that of the transmitting device 100, so that, taking account of the receiver-specific hash function HF1 which is stored in the memory 230, it is able to form a dedicated hash value for the first telegram number "1" which must match the hash value contained in the received control telegram T(K1). If this is the case, the receiving device 200 can thereby recognize that the received control telegram T(K1) is intended for it and has the correct telegram number and is therefore valid. In this case, it will generate a control signal ST1 to activate the switch S1 for a predefined time duration, as has already been explained in connection with FIG. 1.

In a corresponding manner, the computing device 120 will in each case form further receiver-specific and telegram-number-specific hash values for the further control telegrams T(K1) which are transmitted to the receiving device 200 and will add them to the control telegrams so that the receiving device 200 can thereby recognize that the control telegrams have been generated in the correct order and are in fact also intended for the receiving device 200.

Similarly, the computing device 120 will form receiver-specific hash values for the control telegrams T(K2) which are transmitted to the receiving device 300. The hash values for the receiving device 300 will be generated with the receiver-specific hash function HF2 which is stored in the memory 130 of the computing device 120.

The validity of the control telegrams T(K2) received in the receiving device 300 can thus likewise be recognized by the computing device 320 in that, taking into account the current telegram number of the expected telegram, a reference hash value is formed using the dedicated hash value former HWB which is stored in the memory 330, and is compared by means of the comparison module VE with the hash value of the received control telegram T(K2). The computing device 320 will generate a control signal ST2 to activate the switch S2 for a predefined time duration only if the hash value in the received control telegram matches the self-formed or expected hash value.

Otherwise, the mode of operation of the arrangement according to FIG. 3 corresponds to the mode of operation according to FIGS. 1 and 2. It can thus also be achieved in the arrangement according to FIG. 3, through the transmission of acknowledgement signals Q(K1) and Q(K2), that the transmitting device 100 can check whether the control telegrams T(K1) and T(K2) transmitted by it are actually received in the two receiving devices 200 and 300. If the control device 100 establishes that the difference between the number of transmitted control telegrams T(K1) and T(K2) and the number of received acknowledgements telegrams Q(K1) and Q(K2) exceeds a predefined differential value, it will preferably stop the transmission of further control telegrams so that the actuator 500 is deactivated. The telegram number or the hash value formed with the hash function allocated at the receiving end corresponding to the respective telegram number is preferably contained in the acknowledgement signals Q(K1) and Q(K2) in each case in encrypted or unencrypted form.

Figure 4:
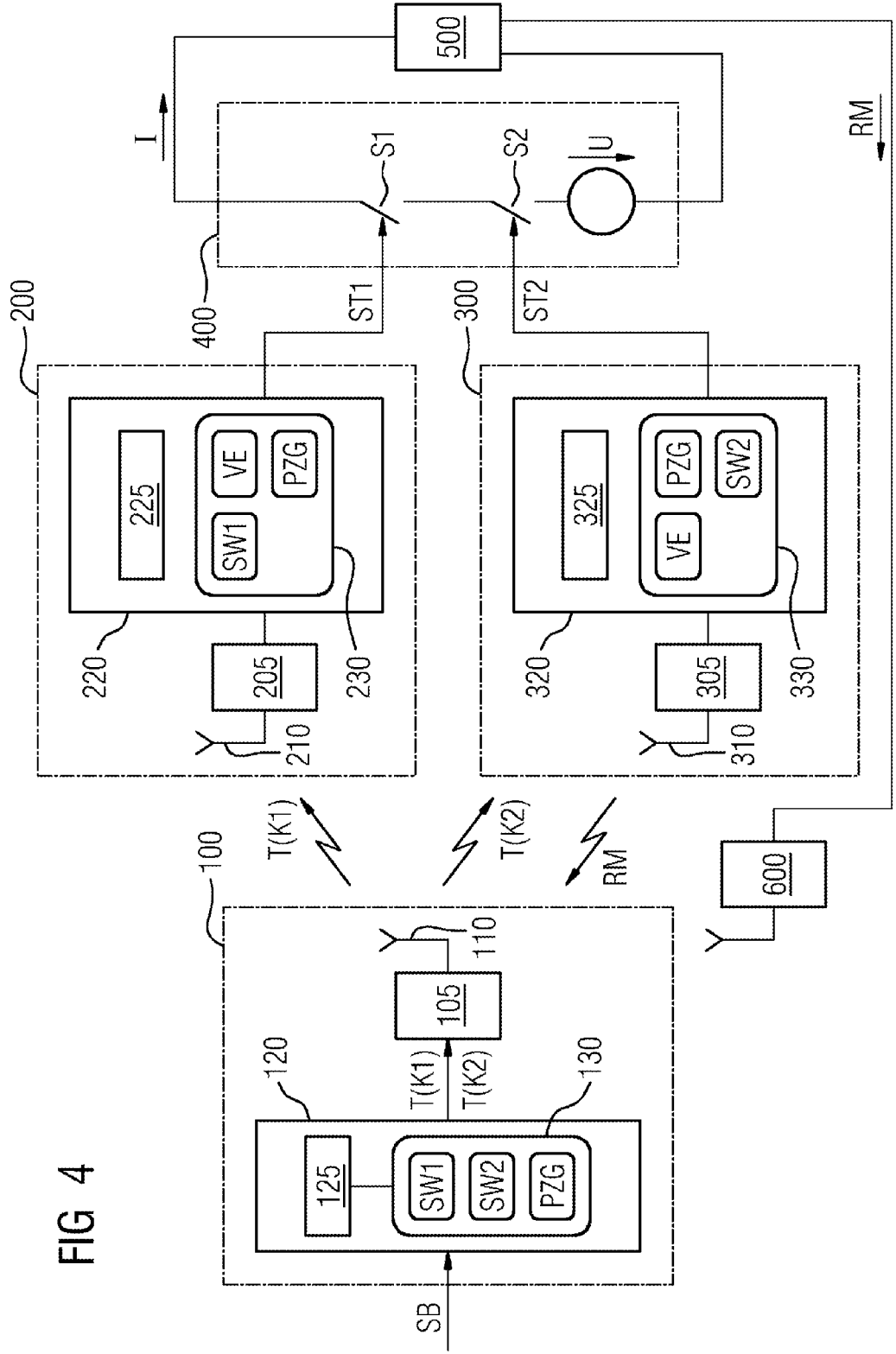
FIG. 4 shows an example embodiment of an arrangement in which the actuator status of an actuator is fed back to the arrangement via a separate feedback branch.

FIG. 4 shows a further example embodiment of an arrangement with a transmitting device 100, a receiving device 200, a further receiving device 300, a decision device 400 and an actuator 500. Unlike the example embodiment according to FIGS. 1 to 3, in the arrangement according to FIG. 4, a feedback device 600 is additionally provided which monitors the switching state of the actuator 500 and transmits a feedback signal RM to the transmitting device 100, indicating the actual switching state of the actuator 500. It can thus be checked at the transmitting end whether the required switching state of the actuator 500 is actually achieved. Otherwise, reference is made to the above descriptions in connection with FIGS. 1 to 3.

In the above example embodiments according to FIGS. 1 to 4, the two receiving devices 200 and 300, the decision device 400 and the actuator 500 form a receive arrangement with an integrated actuator for a reliable reception of control commands.

Although the invention has been illustrated and described in detail through preferred example embodiments, the invention is not limited by the disclosed examples, and other variations can be derived herefrom by the person skilled in the art without departing from the protective scope of the invention.

The invention claimed is:

1. An arrangement with an actuator, the arrangement comprising:
   at least one transmitting device configured for transmitting control telegrams each containing a predefined control command for the actuator or itself forming the predefined control command;
   at least two receiving devices configured for receiving the control telegrams from said at least one transmitting device and for generating a control signal for the actuator; and
   a decision device connected between said at least two receiving device and the actuator, said decision device being configured to generate a release signal allowing the control signal of the receiving devices to be implemented by the actuator only if the control signal is present from all receiving devices or from at least a predefined minimum number of receiving devices;

said at least one transmitting device being configured to transmit the predefined control command in each case to each said receiving device with a receiver-specific control telegram, wherein each receiver-specific control telegram is provided with a respective check datum indicating a consecutive number of the respectively transmitted control telegram in encrypted or unencrypted form; and each of said at least two receiving devices being configured to accept a received control telegram as valid for it on a basis of the check datum if the check datum indicates a telegram number that matches the consecutive telegram number expected at a receiving end and, if the received control telegram is considered valid, to generate the control signal for the actuator in each case for a predefined time duration.

2. The arrangement according to claim 1, wherein said at least one transmitting device has a check datum generator configured to generate the check datum in a receiver-specific manner for each said receiving device depending on the consecutive telegram number of the control telegram to be transmitted and a receiver-specific seed datum or a receiver-specific seed value.

3. The arrangement according to claim 2, wherein:
said check datum generator comprises a pseudorandom number generator and the receiver-specific seed values are receiver-specific start values for said pseudorandom number generator; and
said check datum generator is configured to form receiver-specific pseudorandom number sequences which are allocated to the telegram number sequence, and wherein the pseudorandom number of the respective receiver-specific pseudorandom number sequence corresponding to the current telegram number of the telegram to be transmitted is selected as the receiver-specific check datum.

4. The arrangement according to claim 3, wherein:
each said receiving device has a respective reference pseudorandom number generator and a comparison device;
said reference pseudorandom number generator is capable of generating the receiver-specific pseudorandom number sequence with the receiver-specific start value; and
said comparison device is configured to check for each receive telegram, on a basis of the consecutive telegram number, whether the transmitted pseudorandom number matches the expected pseudorandom number according to the pseudorandom number sequence, and to generate the control command if the comparison of the check datum indicates a match.

5. The arrangement according to claim 4, wherein said comparison device is configured to regard the transmitted pseudorandom number as the expected pseudorandom number according to the pseudorandom number sequence if the transmitted pseudorandom number falls within a sequence segment defined by a predefined number of sequentially consecutive pseudorandom numbers and containing within the sequence segment the pseudorandom number expected on the basis of the consecutive telegram number.

6. The arrangement according to claim 2, wherein said check datum generator of said at least one transmitting device comprises a hash value former configured to generate a receiver-specific hash value with the current telegram number of the telegram number sequence and a receiver-specific hash function as a receiver-specific check datum.

7. The arrangement according to claim 6, wherein:
each said receiving device comprises a reference hash value former and a comparison device; and
said reference hash value former is configured to generate a reference hash value with the receiver-specific hash function and the telegram number of a next telegram expected on the basis of the consecutive telegram number of a previously received telegram; and
said comparison device is configured to check for each received telegram whether a transmitted hash value matches the reference hash value and to generate the control command if the comparison indicates a match.

8. The arrangement according to claim 1, wherein:
the actuator is an actuator of a rail vehicle and the arrangement is configured as a control arrangement for controlling the actuator of the rail vehicle; and
said at least one transmitting device is configured to generate a command for retaining an active actuator setting as a control command; and
the actuator is configured to revert to a passive actuator setting if no release signal is present from said decision device.

9. The arrangement according to claim 1, wherein:
said receiving devices are configured to acknowledge a receipt of control telegrams in each case by transmitting to said transmitting device an acknowledgement telegram with a receiver-specific and telegram-number-specific check datum; and
said transmitting device is configured to set a transmission of further control telegrams if a difference between a number of transmitted control telegrams and a number of received acknowledgement telegrams exceeds a predefined differential value.

10. The arrangement according to claim 1, wherein said decision device comprises an AND element configured to form the release signal for the actuator only if all said receiving devices have generated the control signal.

11. A transmitting device for an arrangement according to claim 1, wherein:
the transmitting device is configured for transmitting control telegrams each containing a predefined control command for an actuator or themselves forming the predefined control command; and
the transmitting device is configured for transmitting the predefined control command in each case to each receiving device with a receiver-specific control telegram, wherein each receiver-specific control telegram is provided with a respective check datum that indicates a consecutive telegram number of a respectively transmitted control telegram in encrypted or unencrypted form.

12. A receiver assembly for an arrangement according to claim 1, the receiver assembly comprising:
an actuator;
at least two receiving devices for receiving control telegrams and generating a control signal for said actuator; and
a decision device connecting said at least two receiving devices to said actuator, said decision device allowing an implementation of the control signals of the receiving devices by said actuator by way of the release signal only if the control signal is present from all receiving devices or at least a predefined minimum number of receiving devices; and
wherein each of said at least two receiving devices is configured to accept a received control telegram as valid for it based on a check datum if the check datum indicates a telegram number which matches the consecutive telegram number expected at a receiving end, and, if a valid control telegram is received, to generate the control signal for said actuator in each case for a predefined time duration.

13. A method for operating an arrangement with an actuator, a transmitting device, at least two receiving devices, and a decision device connected between the receiving devices to the actuator, the method which comprises:

transmitting with the transmitting device control telegrams each containing a predefined control command for the actuator or itself forming the predefined control command;

receiving the control telegrams and generating the control signals for the actuator with the at least two receiving devices; and allowing with the decision device an implementation of the control signals of the receiving devices by the actuator by issuing a release signal only if the control signal is present from all receiving devices or at least a predefined minimum number of receiving devices;

transmitting with the transmitting device the predefined control command in each case to each receiving device with a receiver-specific control telegram, wherein each receiver-specific control telegram is provided with a check datum that indicates a consecutive telegram number of a respectively transmitted control telegram in encrypted or unencrypted form; and accepting with each of the receiving devices a received control telegram as valid for it on a basis of the check datum if the check datum indicates a telegram number that matches the consecutive telegram number expected at a receiving end, and, if a valid control telegram is received, generating the control signal for the actuator in each case for a predefined time duration.

* * * * *